(12) United States Patent
Shkalim et al.

(10) Patent No.: US 11,348,224 B2
(45) Date of Patent: May 31, 2022

(54) MASK INSPECTION OF A SEMICONDUCTOR SPECIMEN

(71) Applicant: Applied Materials Israel Ltd., Rehovot (IL)

(72) Inventors: Ariel Shkalim, DN Sede-Gat (IL); Vladimir Ovechkin, Ashdod (IL); Evgeny Bal, Natanya (IL); Ronen Madmon, Mazkeret Batia (IL); Ori Petel, Ramat-Gan (IL); Alexander Chereshnya, Kfar Saba (IL); Oren Shmuel Cohen, Tel Aviv (IL); Boaz Cohen, Lehavim (IL)

(73) Assignee: Applied Materials Israel Ltd., Rehovot (IL)

( * ) Notice: Subject to any disclaimer, the term of this patent is extended or adjusted under 35 U.S.C. 154(b) by 131 days.

(21) Appl. No.: 16/833,380

(22) Filed: Mar. 27, 2020

(65) Prior Publication Data

US 2021/0073963 A1    Mar. 11, 2021

Related U.S. Application Data

(60) Provisional application No. 62/898,875, filed on Sep. 11, 2019.

(51) Int. Cl.
*G06T 7/00* (2017.01)
*G06T 1/00* (2006.01)
(Continued)

(52) U.S. Cl.
CPC .......... *G06T 7/001* (2013.01); *G03F 7/70666* (2013.01); *G06T 1/0014* (2013.01);
(Continued)

(58) Field of Classification Search
CPC .............. G06T 7/001; G06T 1/0014; G06T 2207/30148; G06T 2207/30141;
(Continued)

(56) References Cited

U.S. PATENT DOCUMENTS 6,272,202 B1 *  8/2001  Chiba .................... G03F 1/50
                                                        378/34
6,324,250 B1 * 11/2001  Amemiya ............... G03F 1/50
                                                        378/34

(Continued)

OTHER PUBLICATIONS

Sagiv et al., "What you see is what you print: aerial imaging as an optimal discriminator between printing and non-printing photomask defects," Proceedings vol. 7028, Photomask and Next-Generation Lithography Mask Technology XV; 70281E, May 19, 2008, 3 pages.

(Continued)

*Primary Examiner* — Sheela C Chawan
(74) *Attorney, Agent, or Firm* — Lowenstein Sandler LLP (57) ABSTRACT

There is provided a mask inspection system and a method of mask inspection. The method comprises: during a runtime scan of a mask of a semiconductor specimen, processing a plurality of aerial images of the mask acquired by the mask inspection system to calculate a statistic-based Edge Positioning Displacement (EPD) of a potential defect, wherein the statistic-based EPD is calculated using a Print Threshold (PT) characterizing the mask and is applied to each of the one or more acquired aerial images to calculate respective EPD of the potential defect therein; and filtering the potential defect as a "runtime true" defect when the calculated statistic-based EPD exceeds a predefined EPD threshold, and filtering out the potential defect as a "false" defect when the calculated statistic-based EPD is lower than the pre- (Continued)

defined EPD threshold. The method can further comprise after-runtime EPD-based filtering of the plurality of "runtime true" defects.

20 Claims, 8 Drawing Sheets

(51) Int. Cl.
*G03F 7/20* (2006.01)
*G01N 21/88* (2006.01)

(52) U.S. Cl.
CPC ........... *G01N 2021/8854* (2013.01); *G06T 2207/10032* (2013.01); *G06T 2207/30141* (2013.01); *G06T 2207/30148* (2013.01)

(58) Field of Classification Search
CPC . G06T 2207/10032; G06T 2207/10061; G06T 7/0004; G06T 7/0006; G06T 7/0008; G03F 7/70666; G01N 2021/8854; G06R 61/0014
USPC .......... 382/100, 141, 144; 356/30, 445, 446, 356/237.1, 237.2; 345/30, 55, 84, 107; 430/30, 31
See application file for complete search history.

(56) References Cited

U.S. PATENT DOCUMENTS

| | | | | |
|---|---|---|---|---|
| 6,327,332 B1* | 12/2001 | Amemiya | ................ | G03F 1/70 378/34 |
| 7,355,690 B2 | 4/2008 | Elyasaf et al. | | |
| 2002/0031725 A1* | 3/2002 | Sugita | ................... | G03F 7/7045 430/311 |
| 2005/0099614 A1* | 5/2005 | Sugita | .................... | G03F 7/701 355/53 |
| 2006/0242619 A1* | 10/2006 | Pang | ...................... | G03F 7/705 716/139 |

OTHER PUBLICATIONS

Verechagin et al., "1. Automated mask and wafers defects classification using a novel method for generalized CD variation measurements," SPIEDigitalLibrary.org/conference-proceedings-of-spie; SPIE Advanced Lithography, 2018, 15 pages.

Shkalim et al., "193nm Mask Inspection Challenges and Approaches for 7nm/5nm Technology and Beyond," In Photomask Technology 2019 (vol. 11148, p. 111481G). International Society for Optics and Photonics, 2019, 10 pages.

Han et al., "Study of high sensitivity DUV inspection for sub-20nm devices with complex OPCs," In Photomask Technology 2014 (vol. 9235, p. 92351K). International Society for Optics and Photonics. Oct. 2014, 3 pages.

* cited by examiner

MASK INSPECTION OF A SEMICONDUCTOR SPECIMEN

RELATED APPLICATION

This application claims the benefit of U.S. Provisional Application No. 62/898,875, filed Sep. 11, 2019, the entire contents of which are incorporated by reference in their entirety.

TECHNICAL FIELD

The presently disclosed subject matter relates, in general, to the field of examination of a specimen, and more specifically, to methods and systems for mask inspection of a specimen.

BACKGROUND

Current demands for high density and performance, associated with ultra large scale integration of fabricated devices, require submicron features, increased transistor and circuit speeds, and improved reliability. Such demands require formation of device features with high precision and uniformity, which, in turn, necessitate careful monitoring of the fabrication process, including automated examination of the devices while they are still in the form of semiconductor wafers. Likewise, mask inspection sensitivity and defect dispositioning remain a gating factor for implementing new lithography technologies, e.g. extreme ultraviolet lithography (EUV)—a next-generation lithography technology using a range of extreme ultraviolet (EUV) wavelengths.

The photolithography mask is a basic component in the semiconductor industry used for printing dies on wafers. Mask Inspection is a process designed to detect and subsequently classify mask defects.

Figure 1:
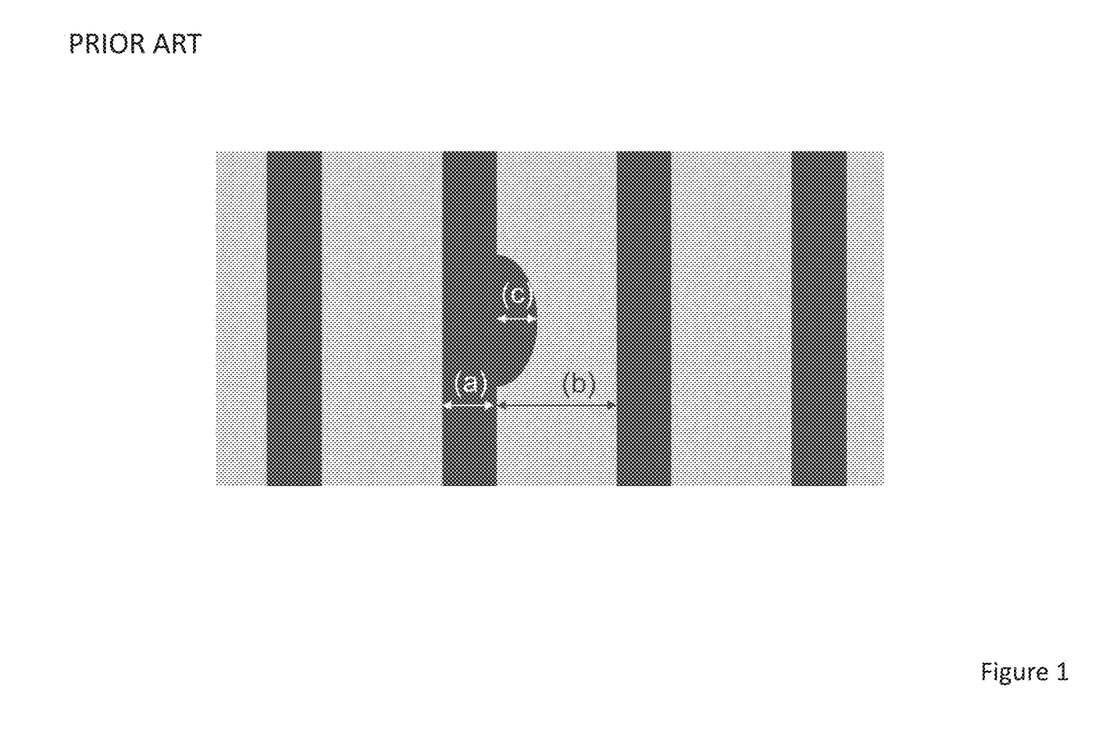
FIG. 1 illustrates a non-limiting example of a line and space pattern with a printing defect.

As known in the art, the ability to project a clear image of a small feature onto the wafer is limited by the wavelength of the light that is used, and the ability of the reduction lens system to capture enough diffraction orders from the illuminated mask. The edges of any feature must be precise and placed in exact locations, which, if not adhered to, will result in misalignment. The difference between the intended and the printed features of the integrated circuit layout is referred to hereinafter as Edge Positioning Displacement (EPD) and is illustrated with reference to FIG. 1 schematically presenting a non-limiting example of a line and space pattern with a printing defect. As illustrated: (a) is the intended line width, (b) is the intended space width, and (c) is the EPD error. The printed line width is: (a)+(c) and the printed space width is (b)−(c). All printed defects can be characterized by respective EPDs.

Since usually many dies on multiple wafers are printed using the same mask, printed defects are critical as they may disqualify the dies by causing electrical disturbances, shorts and bridges. Thus, there is a need to detect all printed defects whilst increasing the effectivity of filtering the false defects and the nuisance defects (referred to hereinafter jointly as "false defects"). False defects can be caused by various reasons as, for example tool noise, pattern noise and a combination thereof (e.g. edge roughness combined with shot noise).

GENERAL DESCRIPTION

In accordance with certain aspects of the presently disclosed subject matter, there is provided a technique of defect filtering during aerial mask inspection using data informative of EPD (Edge Positioning Displacement) parameters, additionally or alternatively to intensity-based parameters.

There is provided a method of mask inspection by a mask inspection system comprising a mask inspection tool and a processing and memory circuitry (PMC). The method comprises: during a runtime scan of a mask of a semiconductor specimen by the mask inspection system: processing, by PMC, a plurality of aerial images of the mask acquired by the mask inspection system to calculate a statistic-based Edge Positioning Displacement (EPD) of a potential defect, wherein the statistic-based EPD is calculated using a Print Threshold (PT) characterizing the mask and is applied to each of the one or more acquired aerial images to calculate respective EPD of the potential defect therein; and filtering the potential defect as a "runtime true" defect when the calculated statistic-based EPD exceeds a predefined EPD threshold, and filtering out the potential defect when the calculated statistic-based EPD is lower than the predefined EPD threshold, thereby giving rise to a "false" defect.

In accordance with other aspects of the presently disclosed subject matter, there is provided a mask inspection system comprising a mask inspection tool operatively connected to a processing and memory circuitry (PMC). PMC is configured to: during a runtime scan of a mask of a semiconductor specimen by the mask inspection system: process a plurality of aerial images of the mask acquired by the mask inspection tool to calculate a statistic-based Edge Positioning Displacement (EPD) of a potential defect, wherein the statistic-based EPD is calculated using a Print Threshold (PT) characterizing the mask and is applied to each of the one or more acquired aerial images to calculate respective EPD of the potential defect therein; and filter the potential defect as a "runtime true" defect when the calculated statistic-based EPD exceeds a predefined EPD threshold, and filter out the potential defect when the calculated statistic-based EPD is lower than the predefined EPD threshold, thereby giving rise to a "false" defect.

The acquired aerial images can be overlapped aerial images related to the potential defect, while the statistic-based EPD can be an averaged EPD obtained by averaging EPDs respectively calculated for the potential defect using each of the overlapped images.

The plurality of acquired aerial images can comprise a plurality of defect aerial images and a plurality of reference aerial images related to a location of the potential defect, the plurality of defect aerial images comprises overlapped images of the location and the plurality of reference aerial images comprises images of corresponding reference locations in one or more reference dies, and wherein, for each of the reference locations, the plurality of reference images comprises multiple overlapped images. The plurality of reference images can be processed to obtain a multi-reference usable for calculating EPD for each image of the plurality of defect aerial images to yield a plurality of EPDs; and the statistic-based EPD can be calculated as a statistical derivative of the EPDs in the plurality of EPDs.

In accordance with further aspects of the presently disclosed subject matter, PT can be calibrated prior to using the PT during the runtime scan. PT calibration can comprise: using a value of a wafer resist threshold to convert an aerial image of a representative pattern with width and length corresponding to a "design intent" in corresponding design data into a binary image; calculating a grey level (GL) threshold for all pixels along the length of the representative pattern; and calculating the calibrated PT as an averaged GL threshold.

In accordance with further aspects of the presently disclosed subject matter, after runtime, the "runtime true" defects can be further EPD-based filtered. The after-runtime EPD-based filtering can comprise, for a given "runtime true" defect: acquiring a plurality of aerial images of the given "runtime true" defect, wherein the plurality of images comprises sets of one or more aerial images acquired after runtime, each set obtained at different focus state throughout the process window; for each set of aerial images calculating a statistic-based EPD value of the given defect, thereby giving rise to a plurality of statistic-based EPD values, each calculated for a different focus state; and filtering out the given defect as a "false" defect if all values in the plurality of statistic-based EPD values are below the predefined EPD threshold.

Among advantages of certain embodiments of presently disclosed subject matter is improving mask inspection by noise reduction and enhanced filtering of false defects.

BRIEF DESCRIPTION OF THE DRAWINGS

In order to understand the invention and to see how it can be carried out in practice, embodiments will be described, by way of non-limiting examples, with reference to the accompanying drawings, in which.

DETAILED DESCRIPTION OF EMBODIMENTS

In the following detailed description, numerous specific details are set forth in order to provide a thorough understanding of the invention. However, it will be understood by those skilled in the art that the presently disclosed subject matter may be practiced without these specific details. In other instances, well-known methods, procedures, components and circuits have not been described in detail so as not to obscure the presently disclosed subject matter.

Unless specifically stated otherwise, as apparent from the following discussions, it is appreciated that throughout the specification discussions utilizing terms such as "processing", "computing", "calculating", "segmenting", "registering" or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities including, by way of non-limiting example, a FPEI system and respective parts thereof disclosed in the present application.

The terms "non-transitory memory" and "non-transitory storage medium" used herein should be expansively construed to cover any volatile or non-volatile computer memory suitable to the presently disclosed subject matter.

The term "defect" used in this specification should be expansively construed to cover any kind of abnormality or undesirable feature formed on or within a specimen.

The term "critical dimension (CD)" used in the specification should be expansively construed as a minimum feature size that a projection system can print at specific structure conditions.

The term "specimen" used in this specification should be expansively construed to cover any kind of wafer, masks, and other structures, combinations and/or parts thereof used for manufacturing semiconductor integrated circuits, magnetic heads, flat panel displays, and other semiconductor-fabricated articles.

The term "examination" used in this specification should be expansively construed to cover any kind of metrology-related operations as well as operations related to detection and/or classification of defects in a specimen during its fabrication. Examination is carried out by using non-destructive examination tools during or after manufacture of the specimen to be examined. By way of non-limiting example, the examination process can include runtime scanning (in a single or in multiple scans), sampling, reviewing, measuring, classifying and/or other operations provided with regard to the specimen or parts thereof using the same or different examination tools. Likewise, at least a part of examination can be carried out prior to manufacture of the specimen to be examined, and can include, for example, generating an examination recipe(s), training respective classifiers or other machine learning-related tools and/or other setup operations. It is noted that, unless specifically stated otherwise, the term "examination" or its derivatives used in this specification, is not limited with respect to resolution or to the size of an inspection area. A variety of non-destructive examination tools includes, by way of non-limiting example, scanning electron microscopes, atomic force microscopes, optical inspection tools, etc.

It is appreciated that, unless specifically stated otherwise, certain features of the presently disclosed subject matter, which are described in the context of separate embodiments, can also be provided in combination in a single embodiment. Conversely, various features of the presently disclosed subject matter, which are described in the context of a single embodiment, can also be provided separately or in any suitable sub-combination. In the following detailed description, numerous specific details are set forth in order to provide a thorough understanding of the methods and apparatus.

Figure 2:
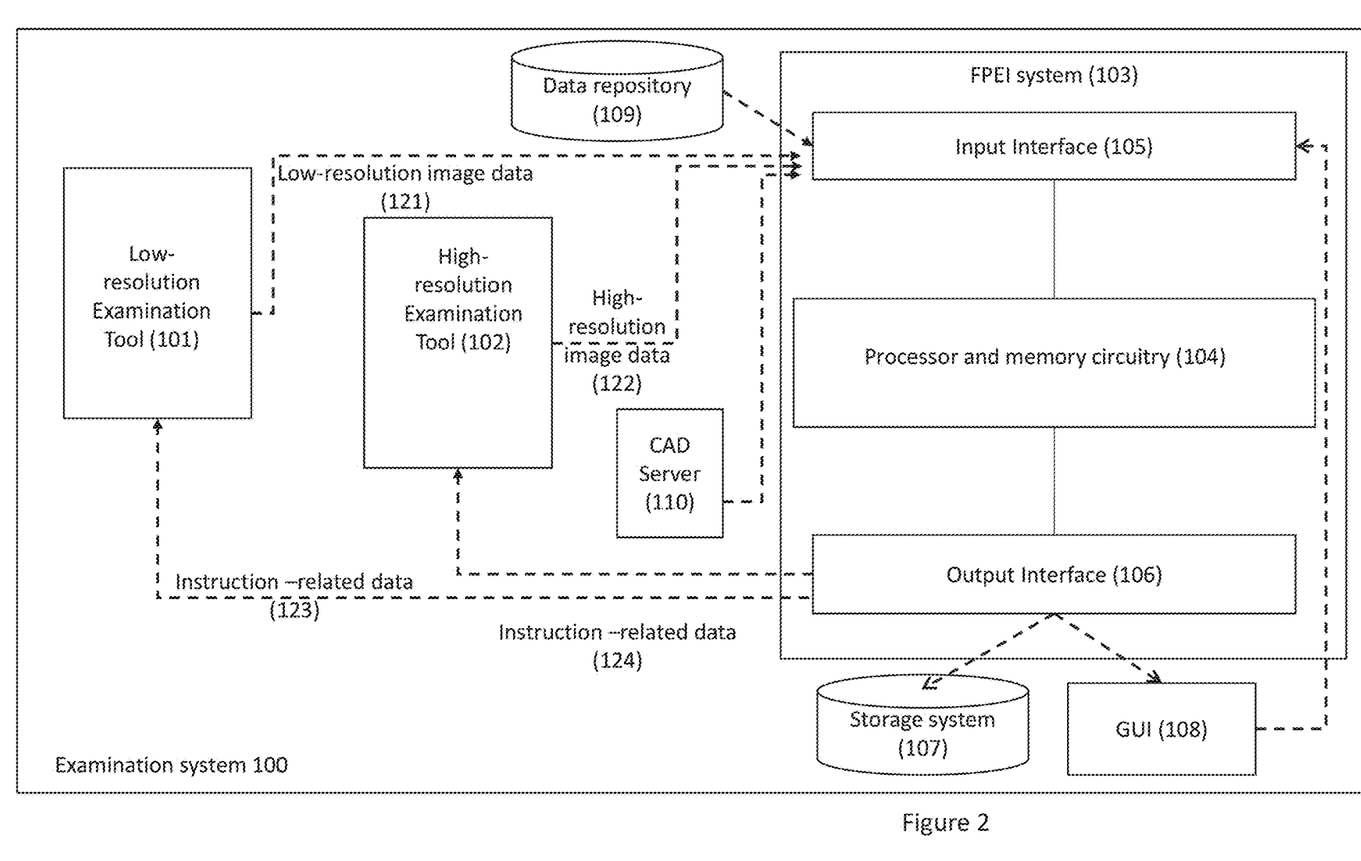
FIG. 2 illustrates a functional block diagram of an examination system in accordance with certain embodiments of the presently disclosed subject matter.

Bearing this in mind, attention is drawn to FIG. 2 illustrating a functional block diagram of an examination system in accordance with certain embodiments of the presently disclosed subject matter. The examination system 100 illustrated in FIG. 2 can be used for examination of a specimen (e.g. of a wafer, mask and/or parts thereof) as part of the specimen fabrication process. The illustrated examination system 100 comprises computer-based system 103 capable of automatically determining metrology-related and/or defect-related information using images obtained during specimen fabrication. Such images are referred to hereinafter as fabrication process (FP) images. The system 103 is referred to hereinafter as an FPEI (Fabrication Process Examination Information) system. FPEI system 103 can be operatively connected to one or more low-resolution examination tools 101 and/or one or more high-resolution examination tools 102 and/or other examination tools. The examination tools are configured to capture FP images and/or to review the captured FP image(s) and/or to enable or provide measurements related to the captured image(s). The FPEI system can be further operatively connected to CAD server 110 and data repository 109.

FPEI system 103 comprises a processor and memory circuitry (PMC) 104 operatively connected to a hardware-based input interface 105 and to a hardware-based output interface 106. PMC 104 is configured to provide all processing necessary for operating the FPEI system as further detailed with reference to FIGS. 2-8 and comprises a processor (not shown separately) and a memory (not shown separately).

As will be further detailed with reference to FIGS. 2-8, FPEI system 103 is configured to receive, via input interface 105, FP input data. FP input data can include data (and/or derivatives thereof and/or metadata associated therewith) produced by the examination tools and/or data produced and/or stored in one or more data repositories 109 and/or in CAD server 110 and/or another relevant data depository. It is noted that FP input data can include images (e.g. captured images, images derived from the captured images, simulated images, synthetic images, etc.) and associated numeric data (e.g. metadata, hand-crafted attributes, etc.). It is further noted that image data can include data related to a layer of interest (including a mask) and/or to one or more other layers of the specimen.

FPEI system 103 is further configured to process at least part of the received FP input data and send, via output interface 106, the results (or part thereof) to a storage system 107, to examination tool(s), and to a computer-based graphical user interface (GUI) 108 for rendering the results and/or to external systems (e.g. Yield Management System (YMS) of a FAB). GUI 108 can be further configured to enable user-specified inputs related to operating FPEI system 103.

Without limiting the scope of the disclosure in any way, it should also be noted that the examination tools can be implemented as inspection machines of various types, such as optical imaging machines, electron beam inspection machines and so on. In some cases the same examination tool can provide low-resolution image data and high-resolution image data. In some cases at least one examination tool can have metrology capabilities.

In certain embodiments of the invention, at least one of the examination tools can be a mask inspection tool capable of detecting printable defects in the masks.

Mask defect detection can be provided by different strategies. For example, a strategy can include hunting for the maximum number of defects, irrespective of their printability content, and later classifying the defects. Typically, such a strategy employs high resolution optics, and later the defects are classified using optical simulation. Another strategy, referred to as aerial imaging inspection, focuses on finding precisely those defects that result in printing deviations when exposed under the scanner conditions.

For purpose of illustration only, the following description is provided for aerial mask inspection tool. Those skilled in the art will readily appreciate that the teachings of the presently disclosed subject matter are, likewise, applicable to images acquired by any suitable technique and further converted to aerial images using an appropriate simulation model. The term "aerial image" should be expansively construed to cover images acquired by an aerial mask inspection tool and aerial images simulated from images captured by non-aerial examination tool(s).

An aerial mask inspection tool is configured to detect defects that would be printed on the wafer using a certain mask by emulating the operation of a lithography tool in which this mask is to be used. The aerial mask inspection tool simulates an optical exposure system that is used to expose photoresist during semiconductor device fabrication. The aerial mask inspection tool can comprise a scanner that uses a set of the same exposure conditions (e.g. wavelength, partial coherence of the exposure light, illumination aperture, imaging numerical aperture of a respective lithographical exposure system, etc.) that are used in the actual lithographic process, thus the optics of the scanner unit emulate the optics of an exposure tool.

Accordingly, the images that can be captured by the scanner are, substantially, the same images that would be produced on the photoresist during an actual device fabrication.

Figure 3:
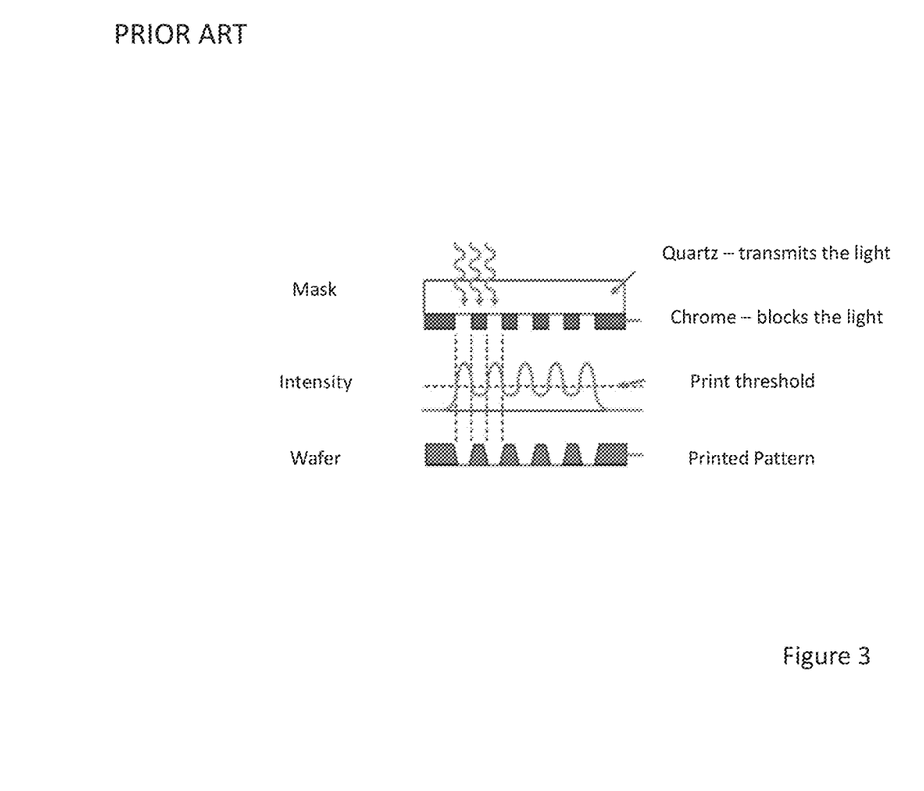
FIG. 3 illustrates a generalized lithography and pattern transfer flow as known in the art.

A generalized lithography and pattern transfer flow is illustrated in FIG. 3. During the lithography process, the wafer is covered by chemical photoresist that responds to the total amount of the absorbed energy. The pattern is printed on the wafer if the mask is illuminated above a specific intensity (causing chemical changes in the resist), this intensity level being referred to hereinafter as a Print Threshold (PT). The Print Threshold corresponds to the grey level of images captured by the scanner.

In accordance with certain embodiments of the presently disclosed subject matter, aerial mask inspection enables exploring the defects which do eventually result in printing deviations when exposed under scanner conditions. It is noted that in aerial imaging, the defect signal scales linearly, and is tightly correlated with the CD variation on the target wafer (see, for example, Amir Sagiv and Shmoolik Mangan et al., "What you see is what you print: aerial imaging as an optimal discriminator between printing and non-printing photomask defects", Proc. SPIE 7028, Photomask and Next-Generation Lithography Mask Technology XV, 70281E (19 May 2008); Sang, H., Hong, Y. et al., "Study of high sensitivity DUV inspection for sub-20 nm devices with complex OPCs", Proc. SPIE9235 (2014), etc.). This quality of aerial imaging detection was shown to be independent of defect attributes (such as type, size, area, phase, transmittance, position, etc.); when the resist development threshold is chosen independent of the pitch value, then the linear relation between aerial imaging defect signal and the associated defect disposition is also independent of the value of the mask pitch.

Referring back to FIG. 2, it is noted that the teachings of the presently disclosed subject matter are not bound by the system illustrated in FIG. 2; equivalent and/or modified functionality can be consolidated or divided in another manner and can be implemented in any appropriate combination of software with firmware and/or hardware.

It is further noted that the examination system illustrated in FIG. 2 can be implemented in a distributed computing environment, in which the functional modules can be distributed over several local and/or remote devices, and can be linked through a communication network. It is also noted that in other embodiments at least part of examination tools 101 and/or 102, data repositories 109, storage system 107 and/or GUI 108 can be external to the examination system 100 and operate in data communication with FPEI system 103 via input interface 105 and output interface 106. FPEI system 103 can be implemented as stand-alone computer(s) to be used in conjunction with the examination tools. Alternatively, the respective functions of the FPEI system can, at least partly, be integrated with one or more examination tools.

For purpose of illustration only, the following description is provided for the examination system comprising FPEI system 103 and aerial mask inspection examination tool (such an examination system is referred to hereinafter also as "aerial mask inspection system" or MIS). The teachings of the presently disclosed subject matter are, likewise, applicable to equivalent and/or modified functionality that can be consolidated or divided in another manner.

Figure 4:
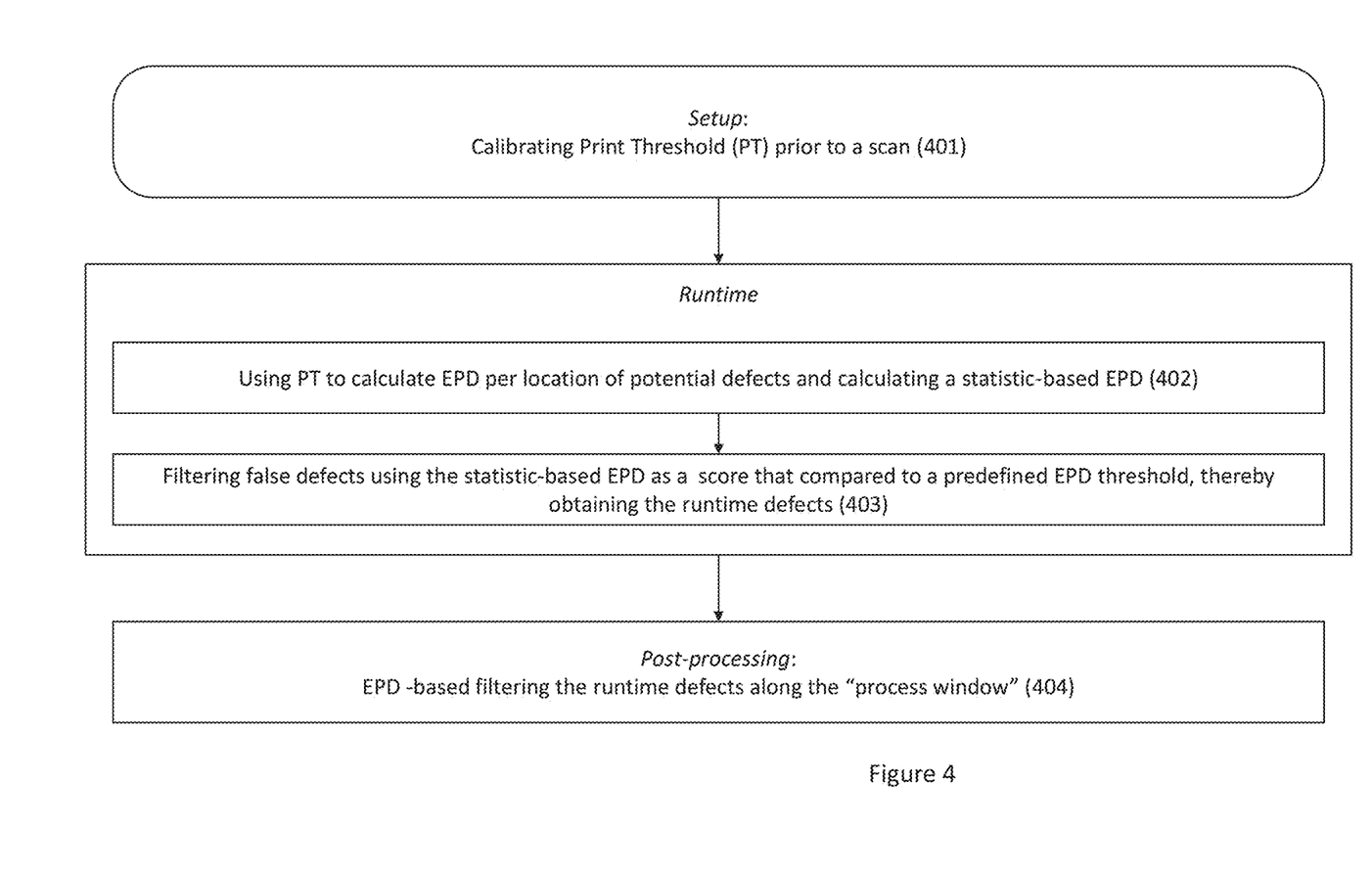
FIG. 4 illustrates a generalized flow chart of an aerial mask inspection process in accordance with certain embodiments of the presently disclosed subject matter.

In accordance with certain embodiments of the presently disclosed subject matter, defect filtering during aerial mask inspection can be provided using data informative of EPD (Edge Positioning Displacement) additionally or alternatively to intensity-based parameters. As illustrated in FIG. 4, the aerial mask inspection process can comprise a setup, a runtime, and a post-processing phase. During the setup phase, there is provided a calibration (401) of PT (Print Threshold) prior to runtime scans (preferably, prior to each scan). The runtime phase includes acquiring aerial images as a result of the runtime scans, and processing the acquired images for runtime, filtering out the false defects. Runtime processing comprises using the calibrated PT to calculate (402) EPD for each potential defect and further runtime filtering (403) the potential defects using their statistic-based EPD (e.g. averaged, weighed-averaged, min, max, mean, etc.) as a score that is compared to a predefined EPD threshold. The post-processing stage includes EPD-based filtering (404) of the defects classified as "true" defects after runtime filtering (referred to hereinafter as "runtime true" defects).

Figure 5:
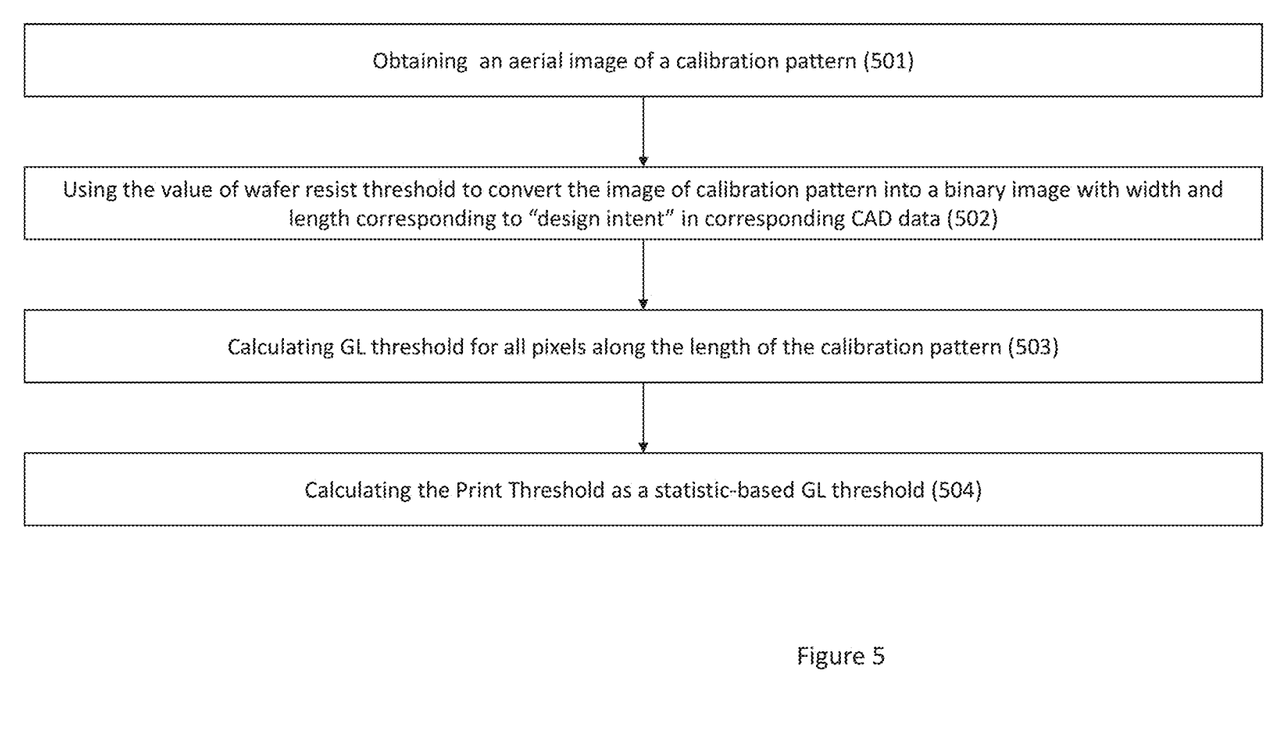
FIG. 5 illustrates a generalized flow chart of a Print Threshold (PT) calibration process in accordance with certain embodiments of the presently disclosed subject matter.

FIG. 5 illustrates a generalized flow chart of Print Threshold (PT) calibration. PT calibration includes the calculation of the PT that corresponds to the respective wafer resist threshold. The PT is calculated on a representative pattern (e.g. selected from a "design intent" CAD clip) with known dimensions. The representative pattern need to be long enough so to enable calculating and further duly averaging of PT across multiple locations therein, thus reducing tool noise and providing high accuracy of PT calculation.

Upon obtaining (501) an aerial image of a representative pattern, the aerial mask inspection system (MIS) uses the value of wafer resist threshold to convert (502) the aerial image of the representative pattern into a binary image with width and length corresponding to "design intent" in corresponding CAD data. MIS further calculates a (503) gray level (GL) threshold for all pixels along the length of the representative pattern and calculates (504) the calibrated PT as an averaged (or otherwise statistic-based) GL threshold. It is noted that, likewise, the calibrated PT can be calculated as min, max, mean or other statistic-based value in relation to the GL threshold.

Optionally, the accuracy of PT calibration can be increased by further calibration, by exposure conditions, and/or calibration by location on the frame.

For purpose of illustration only, the following description is provided for the averaged EPD. The teachings of the presently disclosed subject matter are, likewise, applicable to other statistic-based EPD (e.g. min, max, mean, weighted average, etc.).

Figure 6:
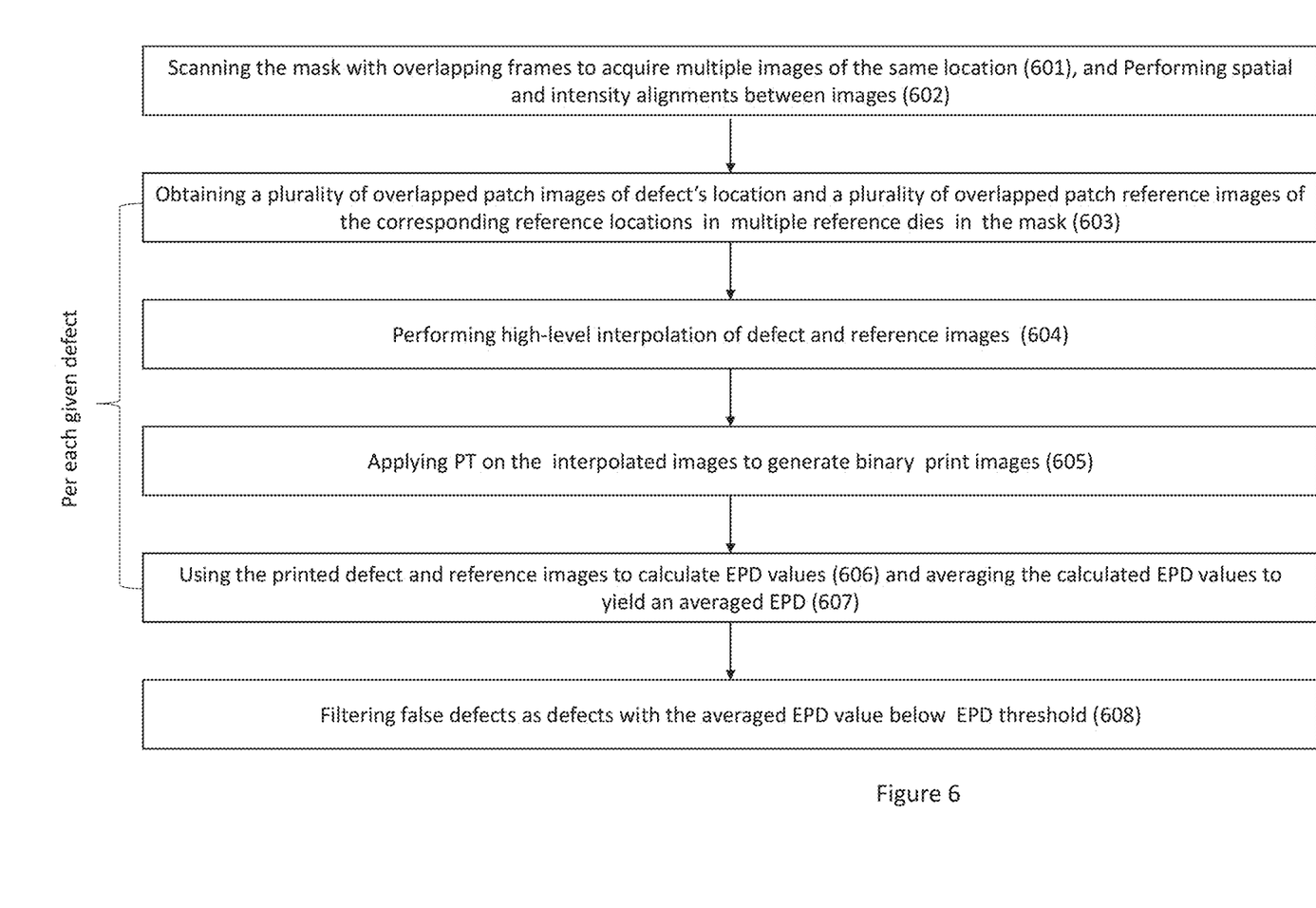
FIG. 6 illustrates a generalized flow chart of runtime filtering defects in accordance with certain embodiments of the presently disclosed subject matter.

Referring to FIG. 6, there is illustrated a generalized flow chart of runtime filtering of defects in accordance with certain embodiments of the presently disclosed subject matter. The mask is scanned (601) with overlapping frames to acquire multiple aerial images of the same locations.

The process of obtaining multiple overlapped aerial images related to a given location is referred to hereinafter as a "multi-shot" process. A non-limiting example of providing multiple overlapped scans of the same location is detailed in U.S. Pat. No. 7,355,690 incorporated herein by reference in its entirety.

Figure 7A:
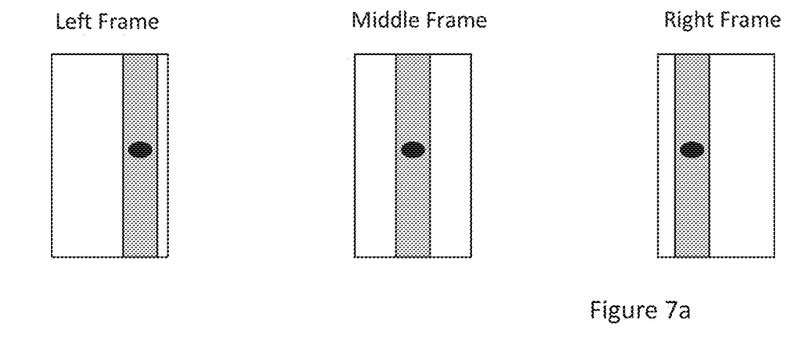
FIG. 7a schematically illustrates a non-limiting example of scanning a mask with overlapping frames in accordance with certain embodiments of the presently disclosed subject matter.

By way of non-limiting example, the mask can be scanned as illustrated in FIG. 7a, taking left, middle and left frames of the same location.

Upon spatial and intensity alignment (602) between the aerial images, MIS processes the acquired aerial images to obtain (603), per defect location (optionally, only for defects in the Regions-of Interest—ROIs), a plurality of defect images and a plurality of reference images related to the respective defect location. The plurality of defect images comprises overlapped patch images of the given defect location. The plurality of reference images comprises patch images of corresponding reference locations in one or more reference dies, wherein, for each of the reference locations, the plurality of reference images comprises multiple overlapped images.

MIS further provides a high (e.g. 3 orders of magnitude) interpolation (604) of the images from the pluralities of defect images and reference defect images. It is noted that the typical pixel size is in the order of tens of nanometers, and the typical size of the edge displacement error is a few nanometers. Therefore, there is a need in interpolation to enable the required precision of a fraction of nanometers.

MIS applies (605) the calibrated PT to the images in the pluralities of defect and reference images, so to generate defect and reference binary print masks informative of printing features on the masks. Subtracting defect and reference print masks results in a print defect map further usable for EPD calculation.

Optionally, prior to generating the print defect map, MIS can use the binary print masks to provide image segmentation. Such image segmentation enables performing EPD calculation merely for defects in the Regions of Interest (ROIs) defined wherever the defect is significant, and avoiding the calculation of EPD on edge roughness. Thereby, the difference between defect and reference binary print masks can be examined only within the ROI.

Figure 7B:
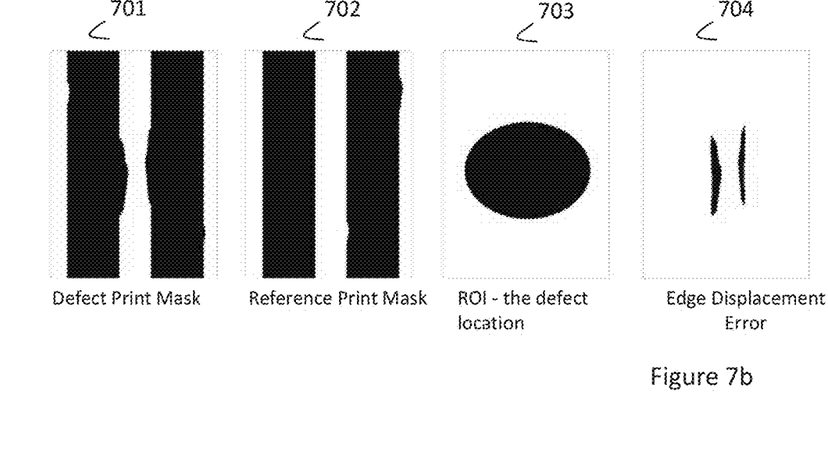
FIG. 7b schematically illustrates a non-limiting example of generating a print defect map in accordance with certain embodiments of the presently disclosed subject matter.

FIG. 7b schematically illustrates a non-limiting example of generating the print defect map. Defect binary print mask 701 is subtracted from binary reference print mask 702. The resulting edge displacement error 704 is obtained merely within the Region of Interest 703.

Thus, MIS uses the printed defect masks and the printed reference masks to calculate (606) EPD values and further averages (607) the calculated EPD values to yield an averaged EPD. The defects with averaged EPD below a predefined EPD threshold are filtered out as "false" defects. The defects with averaged EPD exceeding the predefined EPD threshold are filtered as defects classified as "true" during runtime (referred to hereinafter also as "runtime true" defects).

Typically, the EPD threshold used for filtering during the runtime scan is predefined in correspondence, but lower than the threshold of damage affecting the production yield. Among the reasons for using a lower EPD threshold during the scan, are accuracy of the scan EPD measurement and a need to consider the worst-case scenario of EPD impact in the entire process window (EPD that was calculated during the runtime scan corresponds to the best focus).

Optionally, for each given defect location, MIS can create a binary print multi-reference mask by combining data informative of the images in the plurality of reference images related to the defect location. Further, for each of the binary print masks derived from an overlapped image of the given defect location, MIS can use the print multi-reference mask to calculate EPD values, and further calculate the average EPD for the given location.

The edge displacement error can consist of several blobs (connected components) belonging to the same defect, have any arbitrary shape, and be located on any pattern. As the EPD value needs to reflect the worst-case scenario, EPD must be measured where the impact on the printing pattern is maximal. For example, in case of a single blob, EPD is measured perpendicular to the pattern boundary and the maximum result is reported. If there are multiple blobs, EPD is calculated in consideration of the interactions of all blobs in each printing or non-printing pattern, which will provide the maximum result.

It is noted that applying the "Multi-Shot" technique throughout the entire detection flow, enables effective random noise reduction. As the noise is AWGN (Additive White Gaussian Noise) independent, the averaging can reduce the noise in both defect and reference images.

Let I be the Image, P be the Pattern and $N_i$ be independent AWGN $\sim(0, \sigma^2)$, ignoring the defect for this calculation, $$I = P + N_i, i \in \{1, 2, \ldots K\} \quad (1)$$

Averaging K multiple images:

$$\text{Averaged } I = \frac{\sum_{i=1}^{K}(P + N_i)}{K} = P + \frac{\sum_{i=1}^{K}(N_i)}{K}, \quad (2)$$

$$\frac{\sum_{i=1}^{K}(N_i)}{K} \sim N\left(0, \frac{\sigma^2}{K}\right)$$

Difference is the Averaged $I_{Defect}$ − Averaged $I_{Reference}$:

$$\left(P + \frac{\sum_{i=1}^{K}(N_{Defi})}{K}\right) - \left(P + \frac{\sum_{i=1}^{K}(N_{Refi})}{K}\right) = \quad (3)$$

$$\frac{\sum_{i=1}^{K}(N_{Defi})}{K} - \frac{\sum_{i=1}^{K}(N_{Refi})}{K} \sim N\left(0, \frac{\sigma^2}{K} + \frac{\sigma^2}{K}\right) = N\left(0, 2\sigma^2\left(\frac{1}{K}\right)\right)$$

Therefore, the potential Noise Reduction Factor (NRF) using K repetitions is:

$$\text{NRF} = \sqrt{1/K} \quad (4)$$

In practice, the reference images are easier to obtain and the K value for the reference image is much higher than the K value for the defect image. By way of non-limiting example, in certain embodiments the measured noise reduction factor was about ~30% (assuming $K_{Reference} \gg K_{Defect}$ and $K_{Defect} = 3$).

Thus, among advantages of the presently disclosed 'Multi-Shot' technique is reducing all kinds of tool noise (shot-noise, noisy pixels, shimmer, crosstalk, etc.) and improving the SNR of both the Diff signal (intensity difference between images) and EPD attributes of the defect. The Diff and EPD are usually un-correlated, since the Diff signal is sensitive to grey level variations on any pattern type, while the EPD is sensitive to minor noise at the pattern edges. Optionally, EPD-based filtering can be applied after the defects have been filtered by the Diff attribute. The EPD-based approach enables ignoring non-printing defects and defects with very small dispositioning values, even if they have high intensity values. Enhanced accuracy of EPD value enables achievement of a high ratio of runtime filtering the false defects.

As detailed above, the EPD threshold is, typically, predefined lower than the threshold of damage affecting the production yield. Accordingly, by the end of a scan, the runtime filtering detailed with reference to FIG. 6 reveals the true (printable) defects and some false defects.

Thus, in accordance with certain embodiments of the presently disclosed subject matter, there is a need to provide the post-processing stage (404). Such post-processing includes filtering out the remaining false defects, and more specifically, separating them from true defects with marginal EPD, while examining them throughout the entire process window. Since, during post-processing, the EPD is recalculated only for a small amount of defects which resulted from the runtime filtering, data collection and calculation duration of the post-processing stage can be considered as a non-limiting factor in terms of total inspection time.

Figure 8:
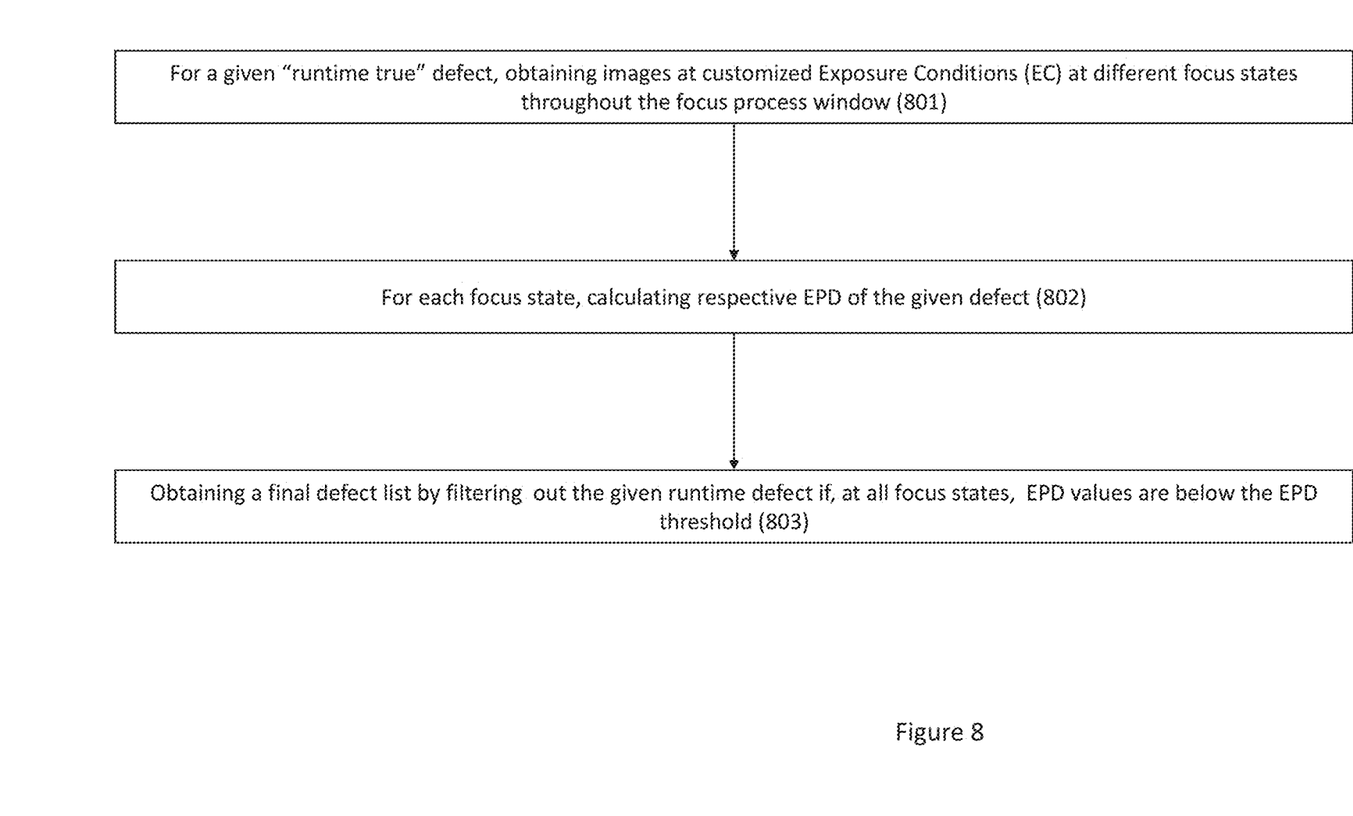
FIG. 8 illustrates a generalized flow chart of post-processing filtering the "runtime true" defects in accordance with certain embodiments of the presently disclosed subject matter.

Referring to FIG. 8, there is illustrated a generalized flow chart of post-process filtering of the "runtime true" defects. For each of the "runtime true" defects, MIS takes one or more images under ideal optical conditions (exposure conditions, pixel size, CCD camera position, etc.) and repeats (801) the image acquisition throughout the focus process window at predefined intervals. By way of non-limiting example, the measurements can be provided in three focus states: at negative defocus, best focus and positive defocus ends of the process window. For each focus state, MIS calculates (802) respective EPDs in a manner detailed above with reference to FIG. 6, and filters out (803) the "runtime true" defects with EPD value below, at all focus states, than the EPD threshold, thereby obtaining a final list of true defects. Optionally, the images acquired in each focus state can be overlapped. Optionally, MIS can further generate multi-references (in a manner similar to the detailed with reference to FIG. 6) and use the generated multi-references in respective EPD calculations.

It is to be understood that the invention is not limited in its application to the details set forth in the description contained herein or illustrated in the drawings. The invention is capable of other embodiments and of being practiced and carried out in various ways. Hence, it is to be understood that the phraseology and terminology employed herein are for the purpose of description and should not be regarded as limiting. As such, the conception upon which this disclosure is based may readily be utilized as a basis for designing other structures, methods, and systems for carrying out the several purposes of the presently disclosed subject matter.

It will also be understood that the system according to the invention may be, at least partly, implemented on a suitably programmed computer. Likewise, the invention contemplates a computer program being readable by a computer for executing the method of the invention. The invention further contemplates a non-transitory computer-readable memory tangibly embodying a program of instructions executable by the computer for executing the method of the invention.

Various modifications and changes can be applied to the embodiments of the invention as hereinbefore described without departing from its scope, defined in and by the appended claims.

What is claimed is:

1. A method of mask inspection by a mask inspection system comprising a mask inspection tool and a processing and memory circuitry (PMC), the method comprising:
during a runtime scan of a mask of a semiconductor specimen by the mask inspection system:
processing, by the PMC, a plurality of aerial images of the mask, the plurality of mask images acquired by the mask inspection system to calculate a statistic-based Edge Positioning Displacement (EPD) of a potential defect, wherein the statistic-based EPD is calculated using a Print Threshold (PT) characterizing the mask and is applied to each of the plurality of acquired aerial images to calculate a respective statistic-based EPD of the potential defect therein; and
filtering the potential defect as a "runtime true" defect when the calculated statistic-based EPD exceeds a predefined EPD threshold, and filtering out the potential defect when the calculated statistic-based EPD is lower than the predefined EPD threshold, thereby giving rise to a "false" defect.

2. The method of claim 1, wherein the plurality of aerial images is acquired by an aerial mask inspection tool comprised in the mask inspection system or is simulated from images captured by a non-aerial mask inspection tool comprised in the mask inspection system.

3. The method of claim 1 further comprising calibrating the PT prior to using the PT during the runtime scan.

4. The method of claim 3, wherein calibrating the PT comprises:
using a value of a wafer resist threshold to convert an aerial image of a representative pattern with width and length corresponding to a "design intent" in corresponding design data into a binary image;
calculating a grey level (GL) threshold for all pixels along the length of the representative pattern; and
calculating the calibrated PT as an averaged GL threshold.

5. The method of claim 1 applied to a plurality of potential defects in a Region of Interest (RoI) to yield a plurality of "runtime true" defects, the method further comprising after-runtime EPD-based filtering of the plurality of "runtime true" defects.

6. The method of claim 5, wherein the after-runtime EPD-based filtering comprises, for a given "runtime true" defect:
acquiring a plurality of aerial images of the given "runtime true" defect, wherein the plurality of aerial images of the given "runtime true" defect comprises sets of one or more aerial images acquired after runtime, each set obtained at a different focus state throughout a process window;
for each set of aerial images, calculating a statistic-based EPD value of the given defect, thereby giving rise to a plurality of statistic-based EPD values, each calculated for a different focus state; and
filtering out the given defect as a "false" defect if all values in the plurality of statistic-based EPD values are below the predefined EPD threshold.

7. The method of claim 1, wherein the plurality of acquired aerial images are overlapped aerial images related to the potential defect, and wherein the statistic-based EPD is an averaged EPD obtained by averaging EPDs respectively calculated for the potential defect using each of the overlapped aerial images.

8. The method of claim 1, wherein the plurality of acquired aerial images comprises a plurality of defect aerial images and a plurality of reference aerial images related to a location of the potential defect, the plurality of defect aerial images comprises overlapped images of the location and the plurality of reference aerial images comprises images of corresponding reference locations in one or more reference dies, and wherein, for each of the reference locations, the plurality of reference images comprises multiple overlapped images.

9. The method of claim 8, further comprising:
processing the plurality of reference aerial images to obtain a multi-reference;
using the multi-reference to calculate an EPD for each image of the plurality of defect aerial images to yield a plurality of EPDs; and
calculating the statistic-based EPD as a statistical derivative of the EPDs in the plurality of EPDs.

10. A mask inspection system comprising a mask inspection tool operatively connected to a processing and memory circuitry (PMC), wherein the PMC is configured to:
during a runtime scan of a mask of a semiconductor specimen by the mask inspection system:
process a plurality of aerial images of the mask acquired by the mask inspection tool to calculate a statistic-based Edge Positioning Displacement (EPD) of a potential defect, wherein the statistic-based EPD is calculated using a Print Threshold (PT) characterizing the mask and is applied to each of plurality of acquired aerial images to calculate respective EPD of the potential defect therein; and
filter the potential defect as a "runtime true" defect when the calculated statistic-based EPD exceeds a predefined EPD threshold, and filter out the potential defect when the calculated statistic-based EPD is lower than the predefined EPD threshold, thereby giving rise to a "false" defect.

11. The system of claim 10, wherein the mask inspection tool is an aerial mask inspection tool.

12. The system of claim 10 further configured to calibrate the PT prior to using the PT during the runtime scan, wherein the PMC is further configured to:
use a value of a wafer resist threshold to convert an aerial image of a representative pattern with width and length corresponding to a "design intent" in corresponding design data into a binary image;
calculate a grey level (GL) threshold for all pixels along the length of the representative pattern; and
calculate the calibrated PT as an averaged GL threshold.

13. The system of claim 10 further configured to yield a plurality of "runtime true" defects, and to provide after-runtime EPD-based filtering of the plurality of "runtime true" defects.

14. The system of claim 13, wherein the after-runtime EPD-based filtering comprises, for a given "runtime true" defect:
acquiring a plurality of aerial images of the given "runtime true" defect, wherein the plurality of aerial images of the given "runtime true" defect comprises sets of one or more images acquired by the mask inspection tool after runtime, each set obtained at a different focus state throughout a process window;
for each set of aerial images, calculating a statistic-based EPD value of the given defect, thereby giving rise to a plurality of statistic-based EPD values, each calculated for a different focus state; and filtering out the given defect as a "false" defect if all values in the plurality of statistic-based EPD values are below the predefined EPD threshold.

15. The system of claim 10, wherein the plurality of acquired aerial images are overlapped aerial images related to the potential defect, and wherein the statistic-based EPD is an averaged EPD obtained by averaging EPDs respectively calculated for the potential defect using each of the overlapped aerial images.

16. The system of claim 10, wherein the plurality of acquired aerial images comprises a plurality of defect aerial images and a plurality of reference aerial images related to a location of the potential defect, the plurality of defect aerial images comprises overlapped images of the location and the plurality of reference aerial images comprises images of corresponding reference locations in one or more reference dies, and wherein, for each of the reference locations, the plurality of reference images comprises multiple overlapped images.

17. The system of claim 16, wherein the PMC is further configured to:
process the plurality of reference aerial images to obtain a multi-reference;
use the multi-reference to calculate an EPD for each image of the plurality of defect aerial images to yield a plurality of EPDs; and
calculate the statistic-based EPD as a statistical derivative of the EPDs in the plurality of EPDs.

18. A non-transitory computer readable medium comprising instructions that, when executed by a processor, cause the processor to perform operations comprising:
during a runtime scan of a mask of a semiconductor specimen by the mask inspection system:
processing, by PMC, a plurality of aerial images of the mask acquired by the mask inspection system to calculate a statistic-based Edge Positioning Displacement (EPD) of a potential defect, wherein the statistic-based EPD is calculated using a Print Threshold (PT) characterizing the mask and is applied to each of the plurality of acquired aerial images to calculate respective EPD of the potential defect therein; and
filtering the potential defect as a "runtime true" defect when the calculated statistic-based EPD exceeds a predefined EPD threshold, and filtering out the potential defect when the calculated statistic-based EPD is lower than the predefined EPD threshold, thereby giving rise to a "false" defect.

19. The non-transitory computer readable medium of claim 18, wherein the plurality of acquired aerial images comprises a plurality of defect aerial images and a plurality of reference aerial images related to a location of the potential defect, the plurality of defect aerial images comprises overlapped images of the location and the plurality of reference aerial images comprises images of corresponding reference locations in one or more reference dies, and wherein, for each of the reference locations, the plurality of reference images comprises multiple overlapped images.

20. The non-transitory computer readable medium of claim 18, wherein the operations further comprise providing after-runtime EPD-based filtering of a "runtime true" defect, the after-runtime EPD-based filtering comprising:
acquiring a plurality of aerial images of the given "runtime true" defect, wherein the plurality of images comprises sets of one or more aerial images acquired after runtime, each set obtained at a different focus state throughout a process window;
for each set of aerial images, calculating a statistic-based EPD value of the given defect, thereby giving rise to a plurality of statistic-based EPD values, each calculated for a different focus state; and
filtering out the given defect as a "false" defect if all values in the plurality of statistic-based EPD values are below the predefined EPD threshold.

* * * * *